(12) United States Patent
Kim et al.

(10) Patent No.: US 7,666,749 B2
(45) Date of Patent: Feb. 23, 2010

(54) SIGE SEMICONDUCTOR DEVICE AND METHOD OF MANUFACTURING THE SAME

(75) Inventors: Sang Hun Kim, Daejeon (KR); Hyun Cheol Bae, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 187 days.

(21) Appl. No.: 11/947,098

(22) Filed: Nov. 29, 2007

(65) Prior Publication Data
US 2008/0128754 A1   Jun. 5, 2008

(30) Foreign Application Priority Data
Nov. 30, 2006  (KR)  ...................... 10-2006-0120077
Feb. 21, 2007  (KR)  ...................... 10-2007-0017226

(51) Int. Cl.
*H01L 21/331* (2006.01)
*H01L 21/8222* (2006.01)
(52) U.S. Cl. ................... 438/309; 438/316; 438/327
(58) Field of Classification Search ................ 438/309, 438/316, 327
See application file for complete search history.

(56) References Cited

U.S. PATENT DOCUMENTS

| 6,982,442 | B2 | 1/2006 | Chan et al. |
| 7,115,459 | B2 | 10/2006 | Bae et al. |

(Continued)

FOREIGN PATENT DOCUMENTS

JP   2006-19631   1/2006

(Continued)

*Primary Examiner*—Phat X Cao
(74) *Attorney, Agent, or Firm*—Rabin & Berdo, PC

(57) ABSTRACT

Provided are a SiGe semiconductor device and a method of manufacturing the same. The method includes the steps of: forming a buried collector by doping impurity ions into a buried collector region formed on a substrate; forming a collector layer which is an active region and a collector electrode region by forming a Si epitaxial layer on the substrate having the buried collector; forming an isolation layer on the substrate and exposing the collector layer and the collector electrode region; forming a collector pad oxide layer on the collector electrode region; stacking a base epitaxial layer and a pad oxide layer on the substrate having the collector pad oxide layer and patterning the pad oxide layer; forming a first polycrystalline Si (poly-Si) layer on the patterned pad oxide layer; exposing at least a portion of the patterned pad oxide layer by etching the first poly-Si layer; depositing a metal layer on the first poly-Si layer to form a first silicide layer; forming an oxide layer on the substrate having the first silicide layer, and exposing a base-emitter junction and the collector electrode region; forming an emitter electrode and a collector electrode by depositing a second poly-Si layer on the exposed base-emitter junction and collector electrode region; and depositing a metal layer on the emitter and collector electrodes to form a second silicide layer, and forming a base terminal, an emitter terminal, and a collector terminal. In this method, base parasitic resistance can be reduced, an electrical short due to agglomeration caused by Ge can be prevented during the formation of the silicide layer, and the base-emitter junction can be protected using the pad oxide layer from external processes, thereby enhancing process stability and reliability.

9 Claims, 7 Drawing Sheets

U.S. PATENT DOCUMENTS 7,151,035 B2 * 12/2006 Koshimizu et al. .......... 438/309
7,456,070 B2 * 11/2008 Johnson ...................... 438/340

FOREIGN PATENT DOCUMENTS

| KR | 10-2002-0012077 | 2/2002 |
| KR | 10-2003-0017747 | 3/2003 |
| KR | 20040038511 | 5/2004 |

* cited by examiner

SIGE SEMICONDUCTOR DEVICE AND METHOD OF MANUFACTURING THE SAME

CROSS-REFERENCE TO RELATED APPLICATION

This application claims priority to and the benefit of Korean Patent Application Nos. 2006-120077, filed Nov. 30, 2006 and 2007-17226 filed Feb. 21, 2007, the disclosures of which are incorporated herein by reference in their entirety.

BACKGROUND

1. Field of the Invention

The present invention relates to a silicon-germanium (SiGe) semiconductor device and a method of manufacturing the same, and more particularly, to a SiGe semiconductor device in which a base electrode on which a silicide layer is formed extends under an emitter electrode, and a method of manufacturing the same.

2. Discussion of Related Art

A SiGe semiconductor device has an advantage of easy control of physical properties, such as an energy band and the mobility of carriers. The rapid development of SiGe semiconductor-related technology has led to practical use of SiGe heterojunction bipolar transistors (HBTs) for ultrahigh-frequency (UHF) circuits required for wireless communications and optical communications and active devices, such as high-speed electronic devices. SiGe HBTs were successfully commercially available before other Si heterojunction devices. The manufacturing technology of SiGe HBTs was sufficiently developed, so that the SiGe HBTs began to compete with Group III-V compound semiconductor devices in yield, reliability, integration density, and production cost. Thus, a variety of SiGe HBTs have already been fit to be practically applied to digital devices, analog devices, radio-frequency (RF) devices, and photoelectric devices.

Conventional SiGe HBTs may be classified into self-aligned SiGe HBTs and non-self-aligned SiGe HBTs. Hereinafter, the structures of conventional self-aligned SiGe HBTs will be described with reference to FIGS. 1A and 1B.

FIGS. 1A and 1B are cross-sectional views of conventional self-aligned SiGe HBTs.

In order to manufacture the self-aligned SiGe HBT shown in FIG. 1A, initially, a buried collector 11, a collector 12, a first collector electrode 14, and an isolation layer 13 are formed on a p-type Si substrate 10. Next, a SiGe base layer 15 is formed on the collector 12 and the isolation layer 13. In this case, a single crystalline base epitaxial layer is formed on the collector 12 and a polycrystalline base layer is formed on the isolation layer 13 to form a base electrode.

Thereafter, a photoresist pattern for defining a base electrode region is formed using photolithography and etching processes, and the polycrystalline base layer except the base electrode region is removed using the photoresist pattern as an etch mask. Then, the photoresist pattern is removed. An oxide layer 16 is deposited on the SiGe base layer 15 and patterned to form an opening for an emitter-base junction. Next, a polycrystalline Si (poly-Si) layer to be an emitter and an emitter electrode are deposited, and then patterned to form an emitter electrode 17a. In this case, the poly-Si layer to be an emitter electrode is also used to form a second collector electrode 17b.

Subsequently, the oxide layer 16 is etched using the emitter electrode 17a as an etch mask, thereby exposing the SiGe base layer 15. Thereafter, $BF_2$ ions are doped using the emitter electrode 17a as a mask. The doped B ions are thermally treated to form an external base 18, which functions to reduce resistance between the base layer 15 and a metal base electrode. An oxide layer is then deposited and etched by an anisotropic dry etching process, thereby forming a spacer on a sidewall of the emitter electrode 17a. A titanium (Ti) layer is coated on the SiGe base layer 15, the emitter electrode 17a and the first collector electrode 14, and thermally treated to form a silicide thin layer 20. After that, the remaining Ti which is unreacted during the formation of the silicide thin layer 20 on the spacer 19 and the isolation layer 13 is removed by a wet etching process. An insulating passivation layer 21 having a plurality of contact holes is formed on the p-type Si substrate 10 having the silicide thin layer 20, and metal interconnections are formed to be electrically connected to the respective electrodes through the contact holes. During a metal interconnection process, a base terminal 22, an emitter terminal 23, and a collector terminal 24 are formed.

In the conventional self-aligned SiGe HBT shown in FIG. 1A, the emitter-base junction can be formed in a self-aligned manner, and the silicide thin layer 20 having low resistance is used as an electrode, thereby greatly reducing contact resistance and parasitic resistance of the base electrode.

However, since the base electrode has a small thickness, agglomeration occurs during the formation of the silicide thin layer 20, so that the silicide thin layer 20 penetrates the base electrode and electrically comes into contact with the collector 12. In order to solve the above-described problem, there is provided a self-aligned SiGe HBT shown in FIG. 1B, which includes a thick base electrode to minimize resistance and prevent occurrence of agglomeration during the formation of the silicide thin layer 20.

In order to manufacture the self-aligned SiGe HBT shown in FIG. 1B, initially, a buried collector region is defined on a p-type Si substrate 30. The buried collector region is doped with n-type impurity ions, such as As ions and then thermally treated to form a buried collector 31, and an isolation layer 33 is formed. Thereafter, a region for a first collector electrode 34 is defined and doped with n-type impurity ions to form the first collector electrode 34. In this case, the first collector electrode 34 is connected to the buried collector 31. Next, a p-type poly-Si layer for a base electrode 36 is grown on the entire resultant structure having the first collector electrode 34. In this case, process conditions are controlled such that a p-type Si epitaxial layer is grown on a collector layer 32 and the first collector electrode 34 and a p-type poly-Si layer is grown on the isolation layer 33. Thereafter, an insulating layer 37, which is formed of a nitride layer or an oxide layer, is coated on the p-type Si epitaxial layer and the p-type poly-Si layer. The whole insulating layer 37 and a portion of the p-type Si epitaxial layer are sequentially etched, thereby forming a groove for forming a base-collector junction and an emitter-base junction. An insulating layer, such as an oxide layer or a nitride layer, is coated on the entire surface of the resultant structure and then etched by an anisotropic dry etching process, thereby forming a spacer 38 on an inner sidewall of the groove. The p-type Si epitaxial layer remaining on the bottom of the groove is completely etched using the insulating layer and the spacer 38 as an etch mask, thereby exposing a predetermined portion of the collector layer 32. Thereafter, a base epitaxial layer 39 is grown on the exposed portion of the collector layer 32 using a selective single crystalline growth technique. An n-type poly-Si layer for an emitter electrode 40a is deposited on the entire surface of the p-type Si substrate 30 and patterned, thereby forming emitter electrode 40a and a second collector electrode 40b on the base epitaxial layer 39 and the first collector electrode 34, respectively. Subsequently, the insulating layer is etched using the emitter electrode 40a as an etch mask, thereby exposing the p-type poly-Si layer. An insulating spacer 41a is formed on a sidewall of an end portion of the emitter electrode 40a, and an insulating spacer 41b is formed on a sidewall of an end portion of the second collector electrode 40b. A silicide thin layer 42 is formed and an ordinary metal interconnection process is performed.

The self-aligned SiGe HBT shown in FIG. 1B has the base electrode 36 with a great thickness, thereby preventing agglomeration generating during the formation of the silicide thin layer 42. However, since a region where the base epitaxial layer 39 will be formed should be defined using a dual etching process, process reliability may be degraded. Also, the selective single crystalline growth process for forming the base epitaxial layer 39 is performed at low speed and difficult to control, thereby deteriorating the economical efficiency and reproducibility. Also, although the base electrode 36 becomes thick, a region of the base electrode 36 on which the silicide thin layer 42 is formed is present only outside the spacer 41a formed on the sidewall of the emitter electrode 40a, thereby resulting in an immaterial decrease in parasitic resistance of the base electrode 36.

FIG. 2 is an enlarged partial cross-sectional view for explaining a parasitic resistance element of a base electrode disposed between a base-emitter junction and a base terminal.

As compared with other Si semiconductor devices, a SiGe semiconductor device is high in ratio of critical frequency to the maximum oscillation frequency, i.e., $f_t/f_{max}$ and in early voltage, and can exactly control a base-emitter junction and accelerate electrons due to a high electric field applied to the base. In particular, the maximum oscillation frequency $f_{max}$ is shown in Equation 1, and determined by base parasitic resistance $R_b$ between the base-emitter junction and a base terminal and junction capacitance $C_{jc}$ between a collector and a base.

$$f_{max} = \sqrt{\frac{ft}{8\pi C_{jc} R_b}} \qquad <\text{Equation 1}>$$

In a conventional HBT, the base parasitic resistance $R_b$ can be expressed by the sum of resistances R1, R2, and R3 shown in FIG. 2, and higher resistances R2 and R3 significantly affect the maximum oscillation frequency $f_{max}$. Here, R3 denotes the resistance of a SiGe base epitaxial layer, R2 denotes the resistance of an external base obtained by doping impurity ions into the SiGe base epitaxial layer to which an emitter electrode is self-aligned, and R1 denotes the resistance of a metal silicide thin layer formed after doping the impurity ions into the SiGe base epitaxial layer. The resistance R2 is much higher than the resistance R1 and lower than the resistance R3. As a result, during manufacture of the SiGe HBT, as the resistances R2 and R3 increase, the parasitic resistance element of the base electrode increases.

SUMMARY OF THE INVENTION

The present invention is directed to a SiGe semiconductor device and a method of manufacturing the same, in which a base electrode is formed to a sufficiently great thickness to prevent occurrence of an electrical short due to agglomeration caused by Ge during formation of a silicide thin layer.

Also, the present invention is directed to a SiGe semiconductor device and a method of manufacturing the same, in which a base electrode on which a silicide layer is formed extends under an emitter electrode to reduce a parasitic resistance element of the base electrode.

Further, the present invention is directed to a SiGe semiconductor device and a method of manufacturing the same in which the size of a base electrode where a silicide layer is not formed is minimized during manufacture of a heterojunction bipolar transistor (HBT) so as to increase the maximum oscillation frequency, which significantly affects the performance of the HBT.

One aspect of the present invention provides a method of manufacturing a SiGe semiconductor device. The method includes the steps of: forming a buried collector by doping impurity ions into a buried collector region formed on a substrate; forming a collector layer which is an active region and a collector electrode region by forming a Si epitaxial layer on the substrate having the buried collector; forming an isolation layer on the substrate and exposing the collector layer and the collector electrode region; forming a collector pad oxide layer on the collector electrode region; stacking a base epitaxial layer and a pad oxide layer on the substrate having the collector pad oxide layer and patterning the pad oxide layer; forming a first polycrystalline Si (poly-Si) layer on the patterned pad oxide layer; exposing at least a portion of the patterned pad oxide layer by etching the first poly-Si layer; depositing a metal layer on the first poly-Si layer to form a first silicide layer; forming an oxide layer on the substrate having the first silicide layer, and exposing a base-emitter junction and the collector electrode region; forming an emitter electrode and a collector electrode by depositing a second poly-Si layer on the exposed base-emitter junction and collector electrode region; and depositing a metal layer on the emitter and collector electrodes to form a second silicide layer, and forming a base terminal, an emitter terminal, and a collector terminal.

A base electrode of the SiGe semiconductor device may include the base epitaxial layer, the first poly-Si layer formed on the base epitaxial layer, and the first silicide layer formed on the first poly-Si layer. The base electrode may be disposed on a region of the collector layer and the isolation layer.

The base epitaxial layer may be a SiGe thin layer deposited using a chemical vapor deposition (CVD) technique. The base epitaxial layer formed on the collector layer may be a single crystalline layer, while the base epitaxial layer formed on the isolation layer may be a polycrystalline layer. The emitter electrode formed by depositing the second poly-Si layer may have an overhang shape. The base electrode may extend under the overhang-shaped emitter electrode.

The first poly-Si layer may be one of a p-type poly-Si layer and an n-type poly-Si layer, and the second poly-Si layer may be a poly-Si layer of a conductivity type opposite to the first poly-Si layer.

Patterning of the pad oxide layer may be performed using a photoresist pattern to leave the pad oxide layer on the base-emitter junction. The pad oxide layer may be formed to have a width greater than that of the base-emitter junction and smaller than that of the emitter electrode. The metal layer for forming the silicide layers may be a titanium (Ti) layer, a cobalt (Co) layer, or a nickel (Ni) layer.

Another aspect of the present invention provides a SiGe semiconductor device including an emitter electrode, a base electrode, and a collector electrode, which are disposed on a substrate having a buried collector, and an emitter terminal, a base terminal, and a collector terminal, which are electrically connected to the emitter electrode, the base electrode, and the collector electrode, respectively. The SiGe semiconductor device may include a silicide layer disposed on the emitter electrode, the base electrode, and the collector electrode. The base electrode on which the silicide layer is formed may extend under the emitter electrode.

The emitter electrode may be formed of an overhang-shaped poly-Si layer heavily doped with impurity ions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein.

Figure 1A:
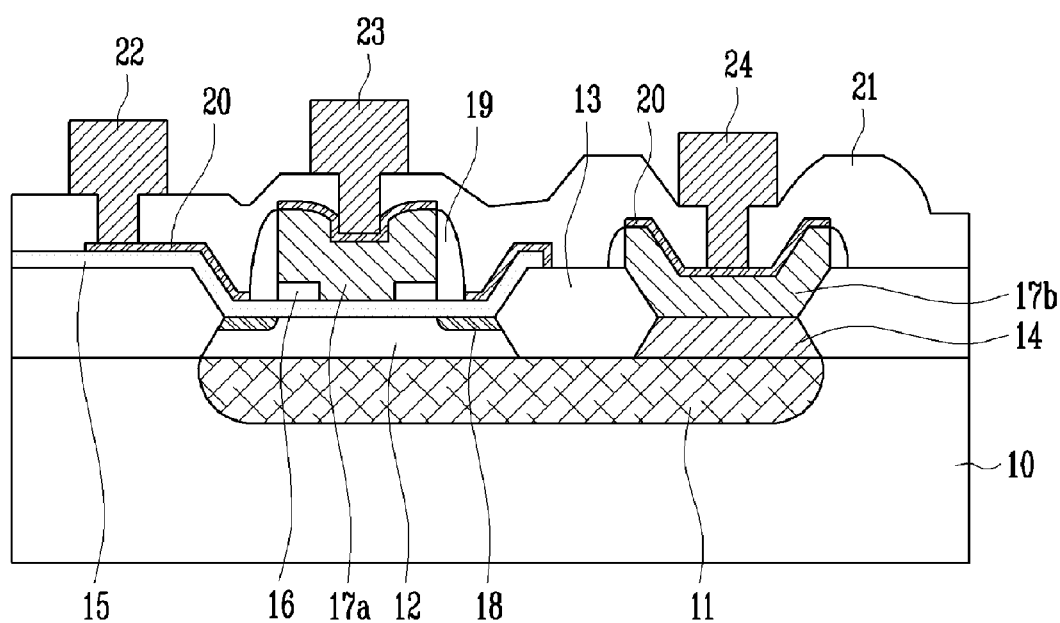
FIGS. 1A and 1B are cross-sectional views of conventional self-aligned SiGe heterojunction bipolar transistors (HBTs)
Figure 1B:
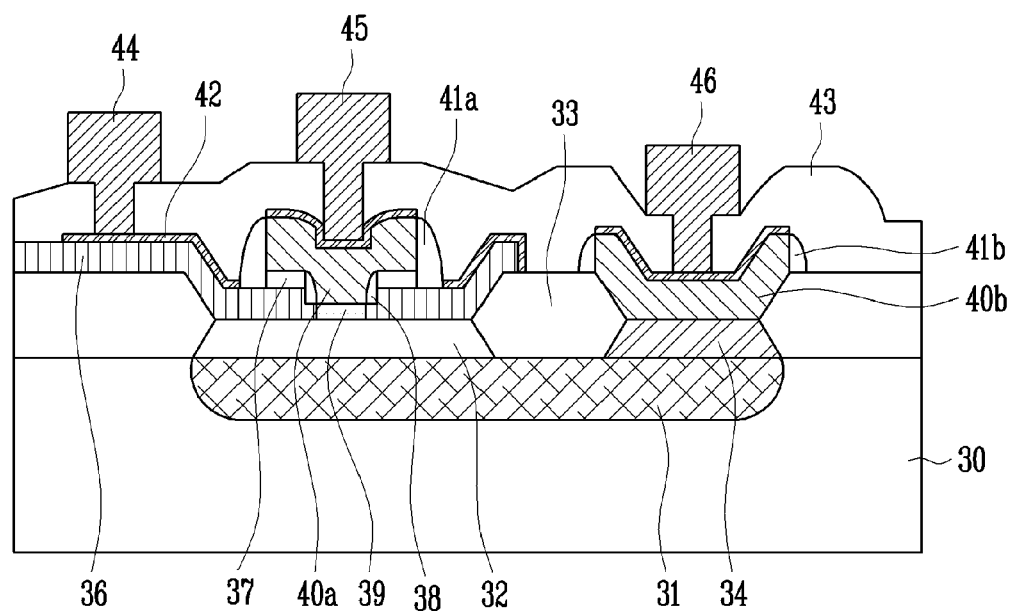
Figure 2:
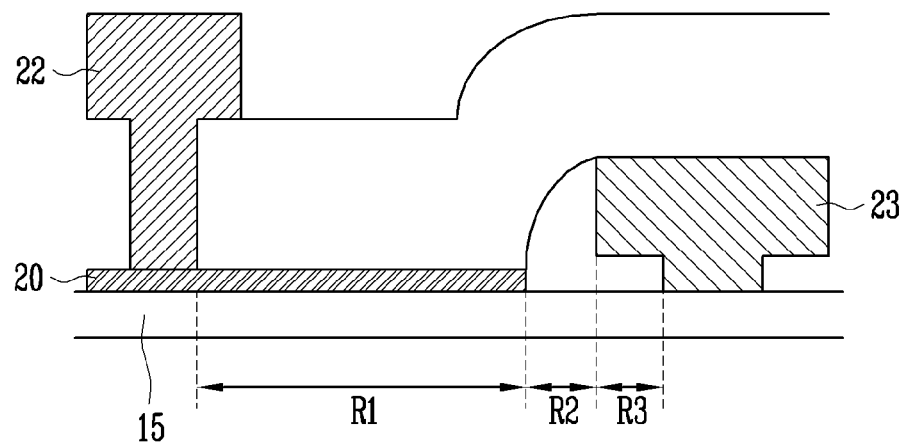
FIG. 2 is an enlarged partial cross-sectional view for explaining a parasitic resistance element of a base electrode disposed between a conventional base-emitter junction and a base terminal.
Figure 3A:
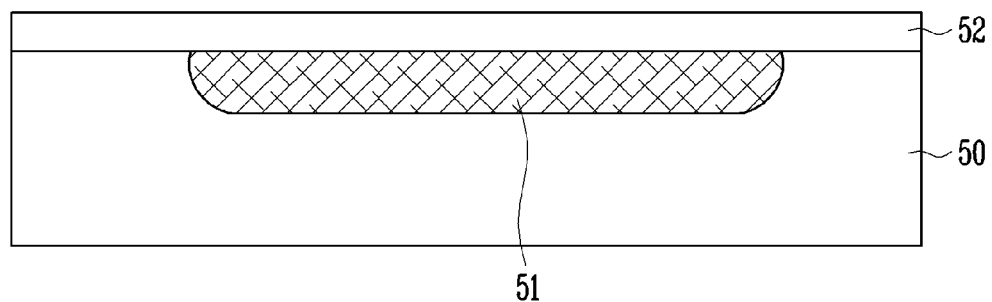
FIGS. 3A through 3G are cross-sectional views illustrating a method of manufacturing a SiGe HBT according to an exemplary embodiment of the present invention.
Figure 3B:
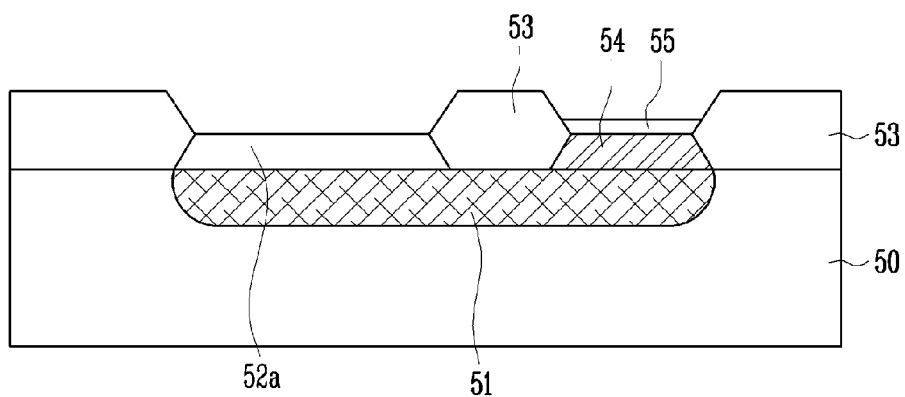
Figure 3C:
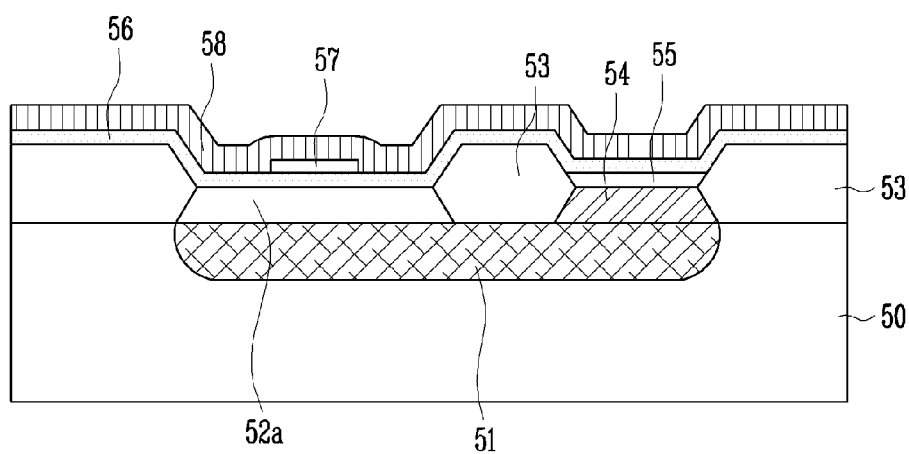
Figure 3D:
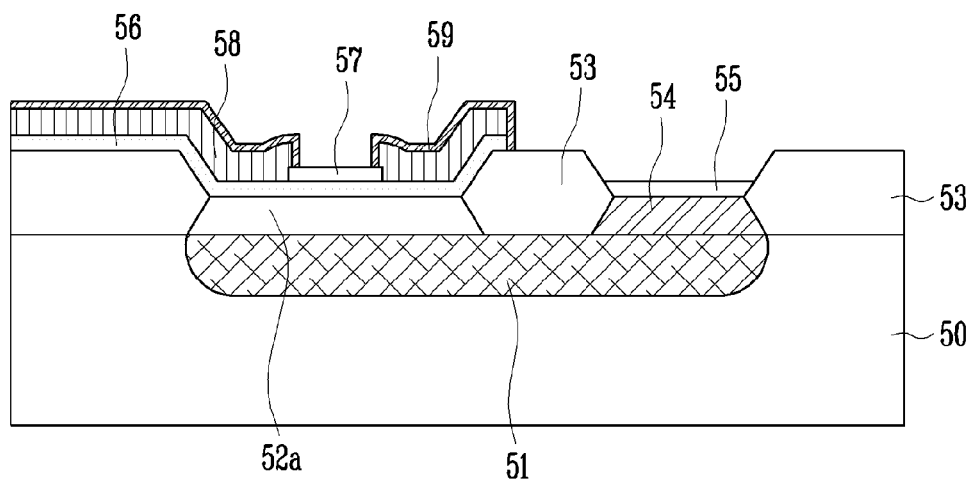
Figure 3E:
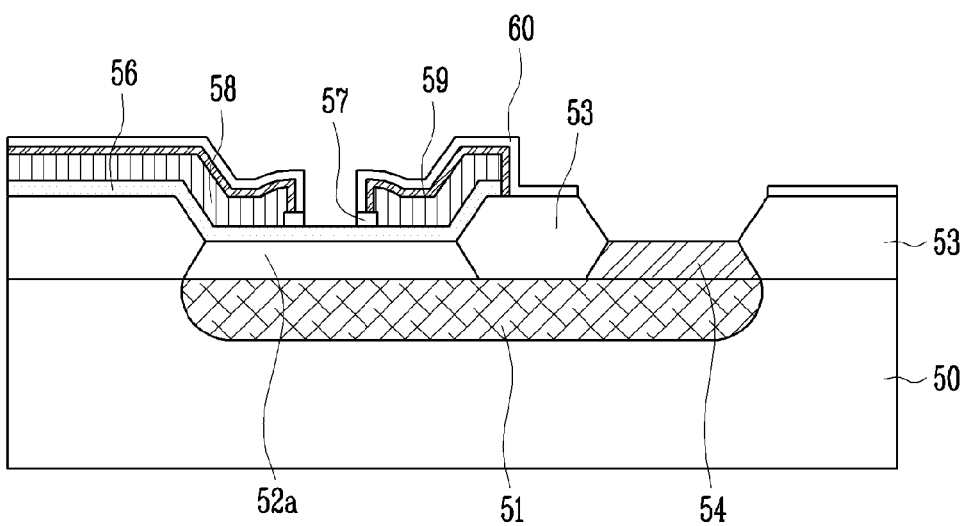
Figure 3F:
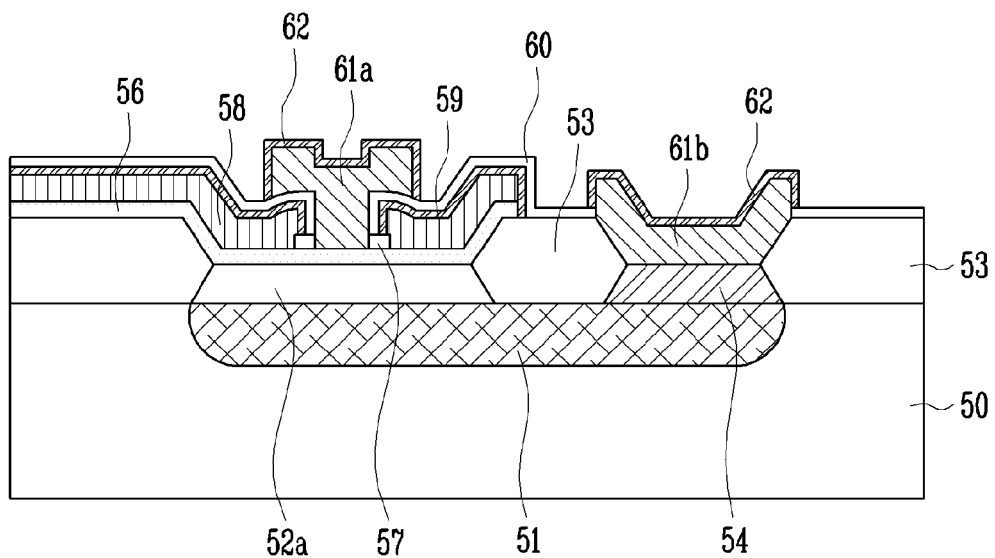
Figure 3G:
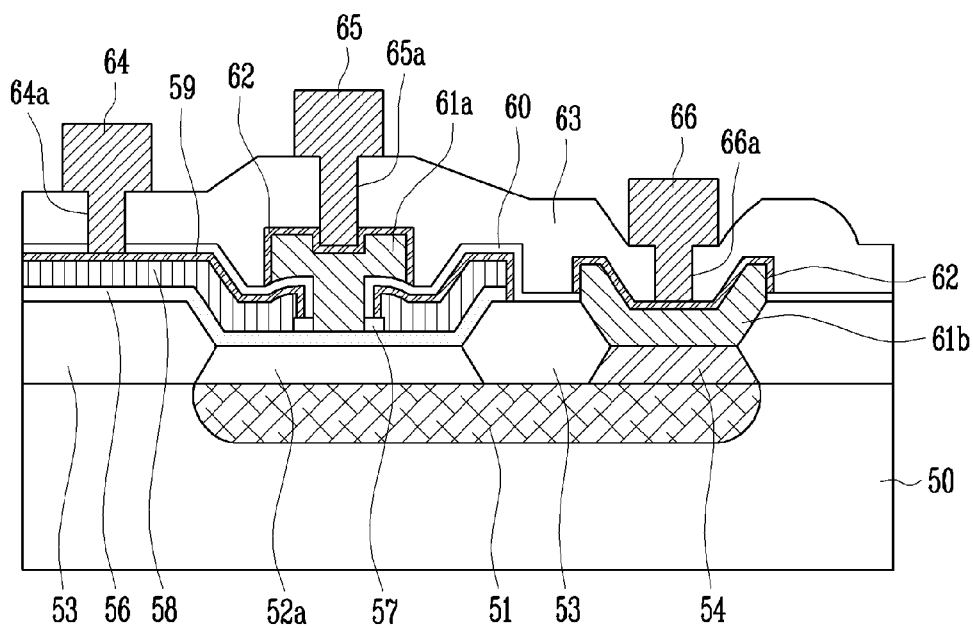
Figure 4:
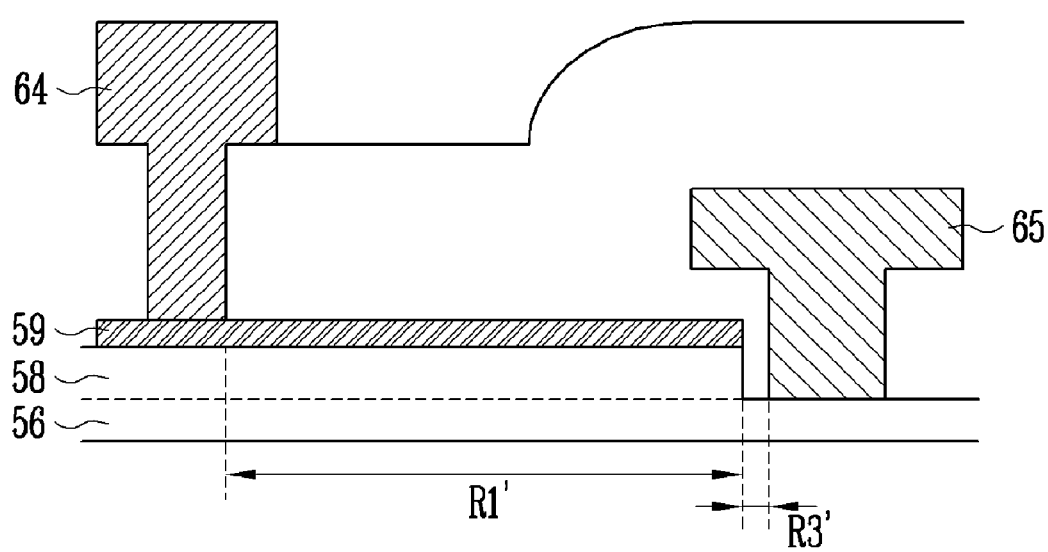
FIG. 4 is an enlarged partial cross-sectional view for explaining a parasitic resistance element of a base electrode disposed between a base-emitter junction and a base terminal according to an exemplary embodiment of the present invention.

FIGS. 3A through 3G are cross-sectional views illustrating a method of manufacturing a silicon-germanium (SiGe) heterojunction bipolar transistor (HBT) according to an exemplary embodiment of the present invention, and FIG. 4 is an enlarged partial cross-sectional view for explaining a parasitic resistance element of a base electrode disposed between a base-emitter junction and a base terminal according to an exemplary embodiment of the present invention. In the present embodiment, an npn-type HBT will be described as an example of an HBT, but a pnp-type HBT also can be applied to the present invention.

Referring to FIG. 3A, in order to manufacture the SiGe HBT, initially, a buried collector region is defined on a p-type Si substrate 50 using a photoresist pattern. The defined buried collector region is doped with n-type impurity ions, such as As ions, and thermally treated to form a buried collector 51. Thereafter, an undoped collector epitaxial layer 52 is grown on the p-type Si substrate 50 having the buried collector 51.

Referring to FIG. 3B, the collector epitaxial layer 52 is doped with n-type impurity ions, such as As ions or P ions, to form a collector layer 52a. A silicon nitride layer (not shown) is formed on the collector layer 52a, and patterned. Thereafter, a thermal oxidation process is performed so that an isolation layer 53 for a field oxide layer is formed on a region other than an active region including the collector layer 52a and a region where a first collector electrode 54 will be formed (hereinafter referred to as a collector electrode region). The remaining silicon nitride layer is removed by etching, and a collector pad oxide layer 55 is coated on the entire surface of the Si substrate 50. After that, the collector electrode region is defined and heavily doped with n-type impurity ions to form the first collector electrode 54. The collector pad oxide layer 55 is removed using a photoresist pattern such that only the collector pad oxide layer 55 formed on the first collector electrode 54 is left. In this case, the collector electrode 54 is connected to the buried collector 51.

Referring to FIG. 3C, a SiGe epitaxial layer 56 for a base is grown on the entire resultant structure having the first collector electrode 54 and the collector pad oxide layer 55. In this case, a polycrystalline Si (poly-Si) —Ge layer is formed on the isolation layer 53 and the collector pad oxide layer 55. Thereafter, a pad oxide layer 57 is coated on the entire resultant structure having the SiGe epitaxial layer 56 and removed by etching using a photoresist pattern such that the pad oxide layer 57 is left only on a region where a base-emitter junction will be formed (hereinafter referred to as a base-emitter junction region). In this case, the left portion of the pad oxide layer 57 is smaller than a poly-Si emitter electrode to be formed later and larger than the base-emitter junction region. Thereafter, a p-type heavily-doped poly-Si layer 58 for a base electrode is grown on the entire resultant structure.

Referring to FIG. 3D, a photoresist pattern for defining the base-emitter junction region is formed, and the p-type poly-Si layer 58 and the SiGe base epitaxial layer 56 are sequentially etched using the photoresist pattern as an etch mask, thereby forming a groove at the base-emitter junction region. The groove exposes the pad oxide layer 57 formed on the SiGe base epitaxial layer 56. Although the p-type poly-Si layer 58 and the SiGe base epitaxial layer 56 are sequentially etched, the first collector electrode 54 is not exposed due to the collector pad oxide layer 55 formed on the first collector electrode 54. Thereafter, a metal layer is deposited on the p-type poly-Si layer 58 in order to form a first silicide layer 59 on the base electrode. The metal layer is formed by depositing a titanium (Ti) layer, a cobalt (Co) layer, or a nickel (Ni) layer. The deposited metal layer is thermally treated to form the first silicide layer 59 on the base electrode.

Referring to FIG. 3E, a silicon oxide layer 60 is deposited on the entire resultant structure and removed to expose the base-emitter junction region and the first collector electrode 54. In this case, the silicon oxide layer 60 and the pad oxide layer 57 are sequentially etched in the base-emitter junction region, while the silicon oxide layer 60 and the collector pad oxide layer 55 are sequentially etched in the collector electrode region.

Referring to FIG. 3F, an n-type poly-Si layer for an emitter electrode is deposited on the entire surface of the resultant structure having the SiGe base epitaxial layer 56 and patterned, thereby forming an overhang-type emitter electrode 61a. In this case, the n-type poly-Si layer is also used to form a second collector electrode 61b. Subsequently, a metal layer is deposited on the emitter electrode 61a and the second collector electrode 61b, and thermally treated, thereby forming a second silicide layer 62 on the emitter electrode 61a and the second collector electrode 61b. The metal layer may be a Ti layer, a Co layer, or a Ni layer. After the second silicide layer 62 is formed, an unreacted portion of the metal layer is completely removed by a wet etching process.

Referring to FIG. 3G, an insulating passivation layer 63 is coated on the entire surface of the p-type Si substrate 50 and then patterned, thereby forming a base contact hole 64a, an emitter contact hole 65a, and a collector contact hole 66a. Thereafter, a metal material is deposited on the insulating passivation layer 63 and then patterned, thereby forming a base terminal 64, an emitter terminal 65, and a collector terminal 66. In this case, the base terminal 64 is connected to the p-type poly-Si layer 58 of the base electrode through the base contact hole 64a, the emitter terminal 65 is connected to the emitter electrode 61a through the emitter contact hole 65a, and the collector terminal 66 is connected to the second collector electrode 61b through the collector contact hole 66a.

In the HBT manufactured by the above-described process, the p-type poly-Si layer 58 is formed on the base epitaxial layer 56 to increase the thickness of the base electrode, and the base electrode on which a silicide layer is formed extends under an emitter electrode, as compared with a conventional self-aligned HBT. In the conventional self-aligned HBT using a thin SiGe base epitaxial layer as a base electrode, since the base electrode is thin, agglomeration caused by Ge may occur during formation of a silicide layer, the silicide layer is very likely to penetrate the SiGe base epitaxial layer and electrically contact a collector. By comparison, in the HBT manufactured according to the present invention, the p-type poly-Si layer 58 is formed on the base epitaxial layer 56 as illustrated in FIG. 3G, agglomeration caused by Ge does not occur.

Referring to FIG. 4, an HBT manufactured according to the present invention can have a base resistance corresponding to the sum of resistances R1' and R3', and the maximum oscillation frequency of the HBT is determined by the resistance R3' that is higher than the resistance R1'. The resistance R1' denotes the resistance of a metal silicide thin layer formed after impurity ions are doped into a SiGe base epitaxial layer, and the resistance R3' denotes the resistance of the SiGe base epitaxial layer. Here, the resistance R1' is even lower than the resistance R3' (R1'☐R3'). Referring to FIG. 4, as compared with a conventional self-aligned HBT, a metal silicide layer is formed near to a base-emitter junction, a region of the SiGe base epitaxial layer having the resistance R3' is reduced, and an external base region formed by doping ions is removed. Thus, a parasitic resistance of the base electrode can be greatly reduced. As a result, the operating speed of the HBT can be improved, and process reliability can be greatly enhanced.

According to the present invention as described above, a thick base electrode is formed on a base epitaxial layer except a base-emitter junction, thereby reducing base parasitic resistance and preventing occurrence of an electrical short due to agglomeration caused by Ge during formation of a silicide thin layer.

Furthermore, unlike in the conventional art, a silicide thin layer is formed near to the base-emitter junction, and an external base, which is formed by doping ions to reduce resistance, is removed, so that the maximum oscillation frequency $f_{max}$, which is determined by the base parasitic resistance, can be greatly increased. Also, the base-emitter junction can be protected using a pad oxide layer from external processes, thereby enhancing process stability and reliability.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a silicon-germanium (SiGe) semiconductor device, comprising the steps of:

forming a buried collector by doping impurity ions into a buried collector region formed on a substrate;

forming a collector layer which is an active region and a collector electrode region by forming a Si epitaxial layer on the substrate having the buried collector;

forming an isolation layer on the substrate and exposing the collector layer and the collector electrode region;

forming a collector pad oxide layer on the collector electrode region;

stacking a base epitaxial layer and a pad oxide layer on the substrate having the collector pad oxide layer and patterning the pad oxide layer;

forming a first polycrystalline Si (poly-Si) layer on the patterned pad oxide layer;

exposing at least a portion of the patterned pad oxide layer by etching the first poly-Si layer;

depositing a metal layer on the first poly-Si layer to form a first silicide layer;

forming an oxide layer on the substrate having the first silicide layer, and exposing a base-emitter junction and the collector electrode region;

forming an emitter electrode and a collector electrode by depositing a second poly-Si layer on the exposed base-emitter junction and collector electrode region; and depositing a metal layer on the emitter and collector electrodes to form a second silicide layer, and forming a base terminal, an emitter terminal, and a collector terminal.

2. The method according to claim 1, wherein a base electrode of the SiGe semiconductor device comprises the base epitaxial layer, the first poly-Si layer formed on the base epitaxial layer, and the first silicide layer formed on the first poly-Si layer, and is disposed on a region of the collector layer and the isolation layer.

3. The method according to claim 2, wherein the base epitaxial layer is a SiGe thin layer deposited using a chemical vapor deposition (CVD) technique, and the base epitaxial layer formed on the collector layer is a single crystalline layer, while the base epitaxial layer formed on the isolation layer is a polycrystalline layer.

4. The method according to claim 1, wherein the emitter electrode formed by depositing the second poly-Si layer has an overhang shape.

5. The method according to claim 4, wherein the base electrode extends under the overhang-shaped emitter electrode.

6. The method according to claim 1, wherein the first poly-Si layer is one of a p-type poly-Si layer and an n-type poly-Si layer, and the second poly-Si layer is a poly-Si layer of a conductivity type opposite to the first poly-Si layer.

7. The method according to claim 1, wherein the step of patterning the pad oxide layer is performed using a photoresist pattern to leave the pad oxide layer formed on the base-emitter junction.

8. The method according to claim 7, wherein the pad oxide layer is formed to have a width greater than that of the base-emitter junction and smaller than that of the emitter electrode.

9. The method according to claim 1, wherein the metal layer for forming the silicide layers is one selected from the group consisting of a titanium (Ti) layer, a cobalt (Co) layer, and a nickel (Ni) layer.

* * * * *